(12) United States Patent
Zhong et al.

(10) Patent No.: US 9,293,377 B2
(45) Date of Patent: Mar. 22, 2016

(54) SEMICONDUCTOR DEVICE STRUCTURE AND METHOD FOR MANUFACTURING THE SAME

(75) Inventors: Huicai Zhong, San Jose, CA (US); Qingqing Liang, Lagrangeville, NY (US); Haizhou Yin, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 1175 days.

(21) Appl. No.: 13/266,607

(22) PCT Filed: Aug. 10, 2011

(86) PCT No.: PCT/CN2011/078221
§ 371 (c)(1),
(2), (4) Date: Oct. 27, 2011

(87) PCT Pub. No.: WO2013/010340
PCT Pub. Date: Jan. 24, 2013

(65) Prior Publication Data
US 2013/0015529 A1  Jan. 17, 2013

(30) Foreign Application Priority Data

Jul. 15, 2011 (CN) .......................... 2011 1 0198180

(51) Int. Cl.
*H01L 21/8234* (2006.01)
*H01L 21/8238* (2006.01)

(52) U.S. Cl.
CPC *H01L 21/823807* (2013.01); *H01L 21/823814* (2013.01); *H01L 21/823864* (2013.01); *H01L 21/823871* (2013.01)

(58) Field of Classification Search
CPC ............ H01L 27/115; H01L 27/11507; H01L 27/11521; H01L 21/28273; H01L 21/823437
See application file for complete search history.

(56) References Cited

U.S. PATENT DOCUMENTS 6,133,098 A    10/2000  Ogura et al. .................. 438/267
6,133,605 A *  10/2000  Kishi ............................ 257/325

(Continued)

FOREIGN PATENT DOCUMENTS

CN          102347277 A        2/2012

OTHER PUBLICATIONS

"Repeated Compressive Stress Increase with 400 C Thermal Cycling in Tantalum Thin Films Due to Increases in the Oxygen Content", by C. Cabral, Jr., et al., *J. Vac. Sci. Technol. B*, Jul./Aug. 1994, pp. 2818-2821.

(Continued)

*Primary Examiner* — Jerome Jackson, Jr.
*Assistant Examiner* — Fang-Xing Jiang
(74) *Attorney, Agent, or Firm* — Westman, Champlin & Koehler, P.A.

(57) ABSTRACT

There are provided a semiconductor device structure and a method for manufacturing the same. The method comprises: forming at least one continuous gate line on a semiconductor substrate; forming a gate spacer surrounding the gate line; forming source/drain regions in the semiconductor substrate on both sides of the gate line; forming a conductive spacer surrounding the gate spacer; and performing inter-device electrical isolation at a predetermined region, wherein isolated portions of the gate line form gates of respective unit devices, and isolated portions of the conductive spacer form contacts of respective unit devices. Embodiments of the present disclosure are applicable to manufacture of contacts in integrated circuits.

8 Claims, 9 Drawing Sheets

(56) References Cited

U.S. PATENT DOCUMENTS

| | | | |
|---|---|---|---|
| 6,593,187 B1* | 7/2003 | Hsieh | H01L 21/28273 257/296 |
| 8,652,884 B2* | 2/2014 | Zhong | H01L 21/823437 257/499 |
| 2002/0033495 A1* | 3/2002 | Kim | 257/296 |
| 2006/0073666 A1 | 4/2006 | Lim et al. | 438/303 |
| 2006/0151821 A1* | 7/2006 | Melik-Martirosian | H01L 27/115 257/298 |

OTHER PUBLICATIONS

"In Situ Stress Measurements in Zirconium and Zirconium Oxide Films Prepared by Direct Current Sputtering", by R. Drese et al., *American Institute of Physics*, 2006, pp. 123517-1-123517-5.

Search Report and Written Opinion from corresponding application PCT/CN2011/078221, dated Apr. 26, 2012 and Apr. 13, 2012, respectively.

First Chinese Office Action for Chinese Patent Application No. 201110198180.5, dated Apr. 3, 2014, 10 pages.

\* cited by examiner (a)

(b)

(a)

(b)

(c)

(a)

(b)

(a)

(b)

SEMICONDUCTOR DEVICE STRUCTURE AND METHOD FOR MANUFACTURING THE SAME

CROSS-REFERENCE TO RELATED APPLICATION

This Application is a Section 371 National Stage Application of International Application No. PCT/CN2011/078221, filed 10 Aug. 2011, which claims priority to Chinese Application No. 201110198180.5, entitled "semiconductor device structure and method for manufacturing the same", filed on Jul. 15, 2011, which are incorporated herein by reference in their entirety.

TECHNICAL FIELD

The present disclosure relates to the semiconductor field, and more particularly, to a semiconductor device structure and a method for manufacturing the same, where contacts are formed in a self-aligned manner and may have great tensile stress or compressive stress.

BACKGROUND

Nowadays, Integrated Circuits (ICs) are increasingly scaled down, and feature sizes thereof are becoming smaller continuously and thus are approaching the theoretical limit of photolithography systems. Therefore, there are typically serious distortions in an image formed on a wafer by photolithography, that is, Optical Proximity Effects (OPEs) occur. As the photolithography technology is facing more strict requirements and challenges, there has been proposed the Double Patterning Technology (DPT) which is able to enhance photolithography resolutions. In the DPT, a circuit pattern with a high density is divided into two separate patterns with lower densities, which are then respectively printed onto a target wafer.

Hereinafter, the line-and-cut DPT for making gates in the conventional semiconductor device manufacture process is described with reference to FIGS. 1-3.

FIG. 1 shows a part of a layout of devices formed on a wafer. As shown in FIG. 1, a pattern of lines 1001, corresponding to a gate pattern to be formed, is printed on the wafer by coating a photo resist, exposing the resist through a mask, and then developing the resist. Here, active regions 1002 on the wafer are also shown. The respective lines of the pattern 1001 are printed in parallel in a single direction, and have same or similar pitches and critical dimensions.

Next, as shown in FIG. 2, cuts 1003 are formed in the pattern of lines 1001 by a further exposure through a cut mask and then development. Thus, in the pattern 1001, gate patterns corresponding to different devices are separated from one another.

Finally, etching is carried out with the photo resist pattern 1001 having cuts 1003 formed therein to achieve gate structures corresponding to this pattern. FIG. 3 shows gates 1005 formed by the etching, and also gate spacers 1006 surrounding the respective gates 1005.

In the above process, a single exposure for forming the gate patterns is divided into two: one for exposing the pattern of lines 1001, and the other for exposing the cuts 1003. As a result, it is possible to reduce the demand for the photolithography and improve the line width control in the photolithography. Further, it is possible to eliminate many proximity effects and thus improve the Optical Proximity Correction (OPC). Furthermore, it is able to ensure a good channel quality and thus guarantee a high mobility for carries in channels.

After the gates 1005 are formed on the wafer by means of etching as described above, the gate spacers 1006 are formed to surround the gates. In FIG. 3, for sake of simplification, no spacer is shown at the uppermost and lowermost sides. However, it is to be noted that there are also spacers 1006 formed at those positions if some gates 1005 terminate at those positions. In one word, the spacers 1006 surround the respective gates 1005. Since there are the cuts 1003 in the gate patterns, the material of the spacers 1006 will enter inside the cuts 1003. Thus, respective spacers of gate patterns on two opposite sides of a cut 1003 may merge into each other, resulting in defects such as voids in the cut 1003. The defects such as voids occurring in the cuts 1003 will cause defects in a dielectric layer (for example, a dielectric layer 2004 as described below) subsequently formed thereon. Those defects will impact performances of resultant devices.

Besides, as shown in FIG. 4, after the formation of gates 2005 on a wafer 2000 and the formation of spacers 2006 surrounding the respective gates 2005 as described above, a dielectric layer 2004 may be deposited on the wafer to keep electrical isolations between respective devices. Here, to form contacts to the gates and sources/drains, it is possible to etch contact holes corresponding to the gates and the sources/drains in the dielectric layer 2004 and fill them with a conductive material such as metal so as to form contacts 2007a and 2007b. In FIG. 4, it is also shown that metal silicides 2008 are formed on the gates and the sources/drains to reduce contact resistance.

In the conventional process, all the contacts, including the contacts 2007a on the sources/drains and the contacts 2007b on the gates, are manufactured by etching the contact holes to their bottoms at one time and then filling the contact holes with the conductive material. This brings a strict requirement on the etching of the contact holes. For example, since the etching depth on the gate is different from that on the source/drain, a short is likely to occur between the gate and the contact hole. Further, since the etching depth on the source/drain is relatively large while the corresponding opening is relatively small (that is, the width to height ratio is relatively small), various problems, such as under-etching, voids in the filled metal, and the like, are likely to occur. Those restrict the selection of manufacture processes and cause greater parasitic resistances as well.

In view of the above, there is a need for a novel semiconductor device structure and a method for manufacturing the same.

SUMMARY

The present disclosure provides, among other things, a semiconductor device structure and a method for manufacturing the same, to overcome the problems in the prior art as described above, and especially, to simplify the formation of contacts.

According to an embodiment, there is provided a method for manufacturing a semiconductor device structure. The method may comprise: forming at least one continuous gate line on a semiconductor substrate; forming a gate spacer surrounding the gate line; forming source/drain regions in the semiconductor substrate on both sides of the gate line; forming a conductive spacer surrounding the gate spacer; and performing an inter-device electrical isolation at a predetermined region, wherein isolated portions of the gate line form gates of respective unit devices, and isolated portions of the conductive spacer form contacts of respective unit devices.

According to another embodiment, there is provided a semiconductor device structure. The structure may comprise: a semiconductor substrate; and a plurality of unit devices formed on the semiconductor substrate. Each of the unit devices may comprise: a gate formed on the semiconductor substrate; a gate spacer formed on both sides of the gate; and contacts formed as a conductive spacer on outer side of the gate spacer. Gates, gate spacers and contacts of respective unit devices adjacent to each other in a gate width direction may be made from one gate line, one gate dielectric layer, and one conductive spacer, respectively. The gate line and the conductive spacer may comprise an electrical isolation at a predetermined region between the adjacent unit devices.

Unlike the prior art where contacts are formed by etching contact holes and then filling conductive materials in the contact holes, the contacts according to embodiments of the present disclosure are manufactured as spacers, thereby eliminating the difficulty in forming the contact holes in the prior art. Further, since the contacts according to embodiments of the present disclosure are manufactured as spacers which are on outer sides of the respective gate spacers, they are self-aligned to the source/drain regions and therefore can serve as contacts for electrical connections between the source/drain regions of the semiconductor device and the outside.

Further, in the present disclosure, the conductive spacers (that is, the lower contacts) and the gate stacks may be made to the same height by planarization. This facilitates subsequent processes.

Furthermore, in the present disclosure, the inter-device electrical isolation (for example, cutting or oxidation) is performed after the formation of the gate spacers and the conductive spacers. Therefore, the gate spacers and the conductive spacers just extend along the outer sides of the respective gate lines, and will not extend into opposing end faces of respective gates of adjacent unit devices. Thus, unlike the prior art, there will be no defects such as voids due to presence of the space materials in the cuts.

Further, the device performance can be further improved by means of stressed conductive spacers and interlayer dielectric layers.

BRIEF DESCRIPTION OF THE DRAWINGS

The above and other objects, features, and advantages of the present invention will be more apparent by describing embodiments thereof in detail with reference to the attached drawings.

DETAILED DESCRIPTION

Figure 1:
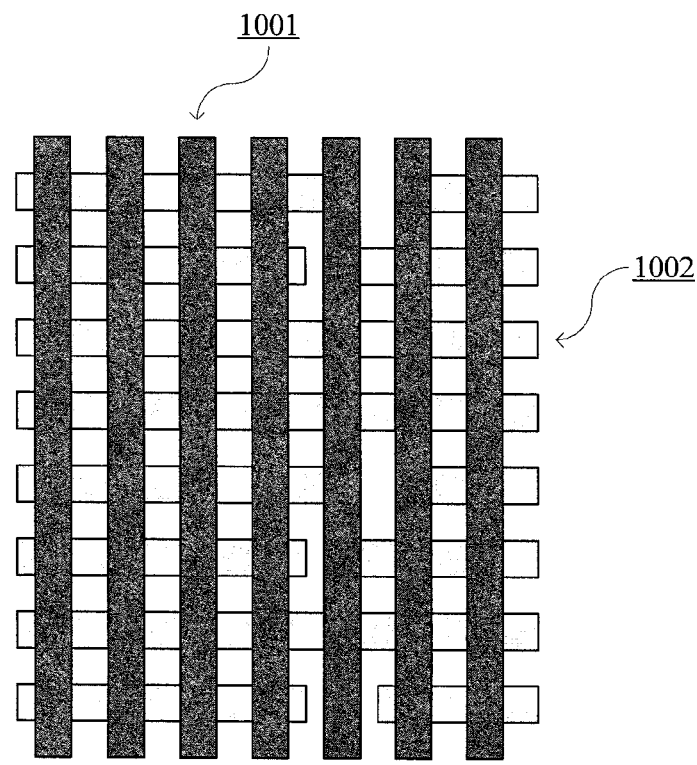
FIGS. 1-4 shows a schematic flow of manufacturing a semiconductor device structure according to the conventional process.
Figure 2:
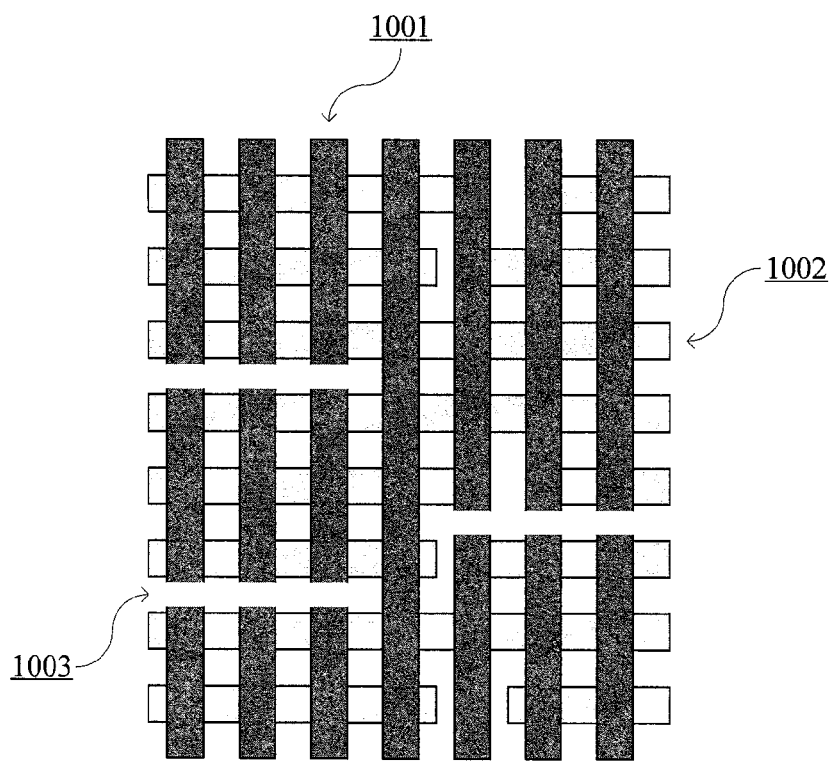
Figure 3:
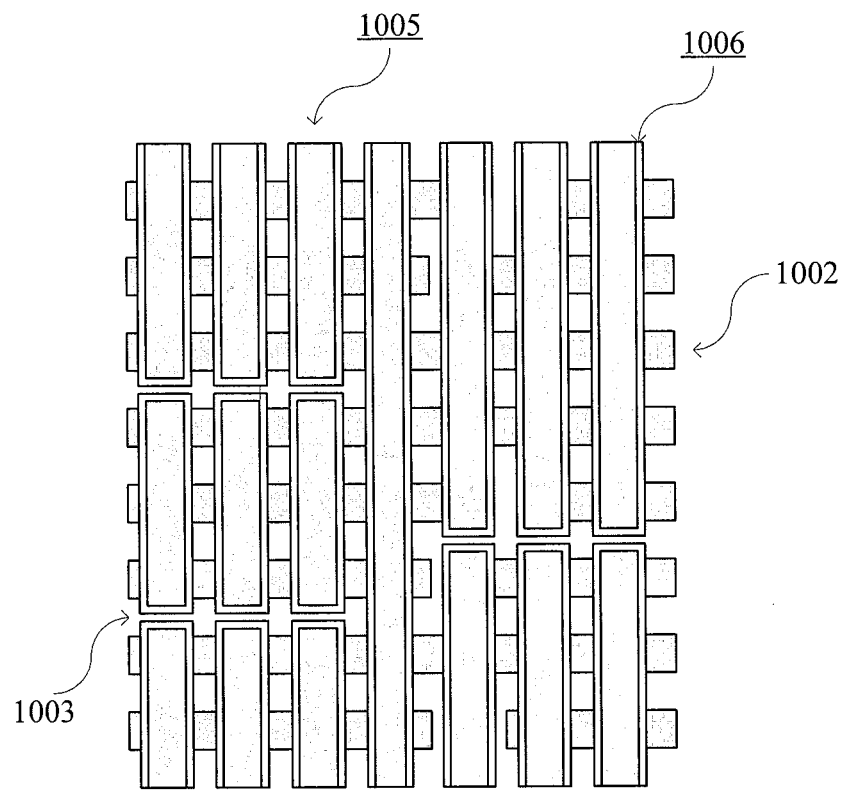
Figure 4:
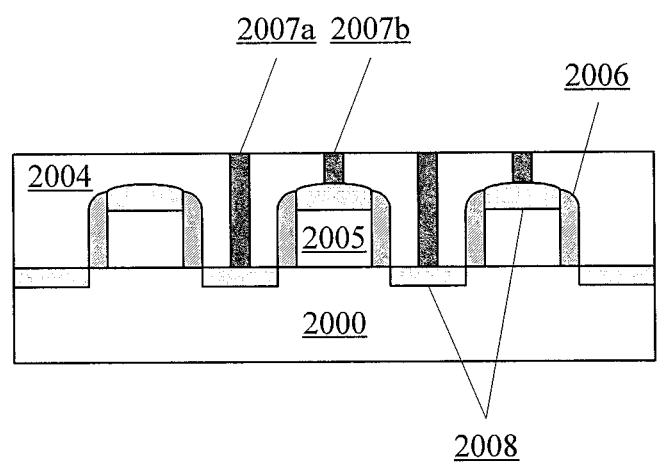

Hereinafter, the present disclosure is described with reference to embodiments shown in the attached drawings. However, it is to be understood that these descriptions are illustrative and not intended to limit the present disclosure. Further, in the following, well-known structures and technologies are not described to avoid obscuring the concept of the present disclosure unnecessarily.

In the drawings, various structures according to embodiments of the present disclosure are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

First Embodiment

Hereinafter, a first embodiment of the present disclosure is described with reference to FIGS. 5-10.

Figure 5:
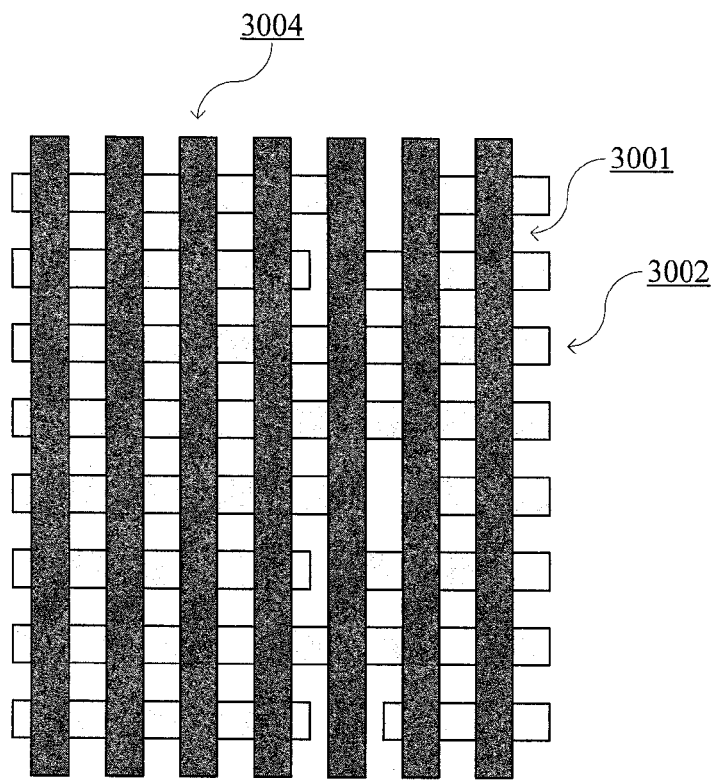
FIGS. 5-10 are schematic diagrams showing device structures during the fabrication of a semiconductor device structure according to a first embodiment of the present disclosure.

FIG. 5 shows a part of a layout formed on a semiconductor substrate. Here, the semiconductor substrate may comprise any suitable semiconductor substrate material, for example, but not limited to, Si, Ge, SiGe, SOI (Silicon on Insulator), SiC, GaAs, or any III-V group compound semiconductor, etc. According to known design requirements (for example, for a p-type substrate or an n-type substrate), the semiconductor substrate may comprise various doping configurations. Further, the semiconductor substrate may optionally comprise an epitaxial layer which may be stressed for performance enhancement. The following descriptions are provided based on a conventional Si substrate by way of example.

In the semiconductor substrate, Shallow Trench Isolations (STIs) 3001 have already been formed, and active regions 3002 are formed in areas surrounded by the STIs 3001. For sake of convenience, FIG. 5 only shows the strip-like active regions 3002 and the strip-like STIs 3001. As to the formation of the STIs and the active regions, references may be made to existing conventional techniques, and the present disclosure is not limited thereto.

Optionally, a gate dielectric layer 3003 (shown in FIG. 7, but not shown in FIG. 5) may be formed on the semiconductor substrate before a gate material layer is formed. The gate dielectric layer may comprise, for example, ordinary dielectric materials, such as $SiO_2$, or high-K dielectric materials, such as one or more selected from $HfO_2$, HfSiO, HfSiON, HfTaO, HfTiO, HfZrO, $Al_2O_3$, $La_2O_3$, $ZrO_2$, and LaAlO, or the like.

Referring to FIG. 5, a gate material layer is deposited on the semiconductor substrate (or optionally, the gate material layer is deposited on a gate dielectric layer 3003, not shown here). A pattern of lines 3004, corresponding to a pattern of gate lines to be formed, is printed by coating a photo resist, exposing the resist through a mask, and then developing the resist. In this example, the lines of the pattern 3004 are printed in parallel in a single direction, and have same or similar pitches and critical sizes.

Figure 6:
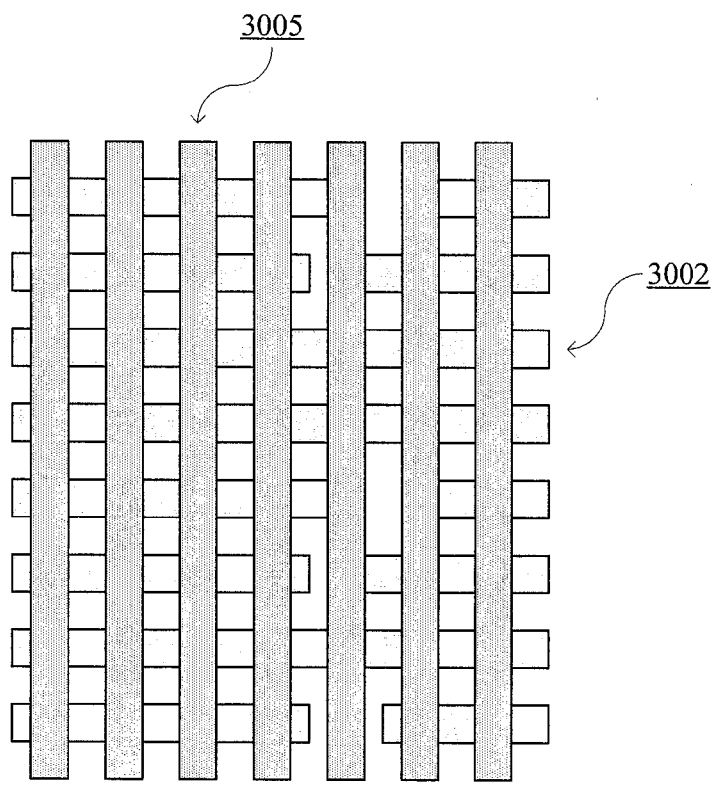
Figure 7:
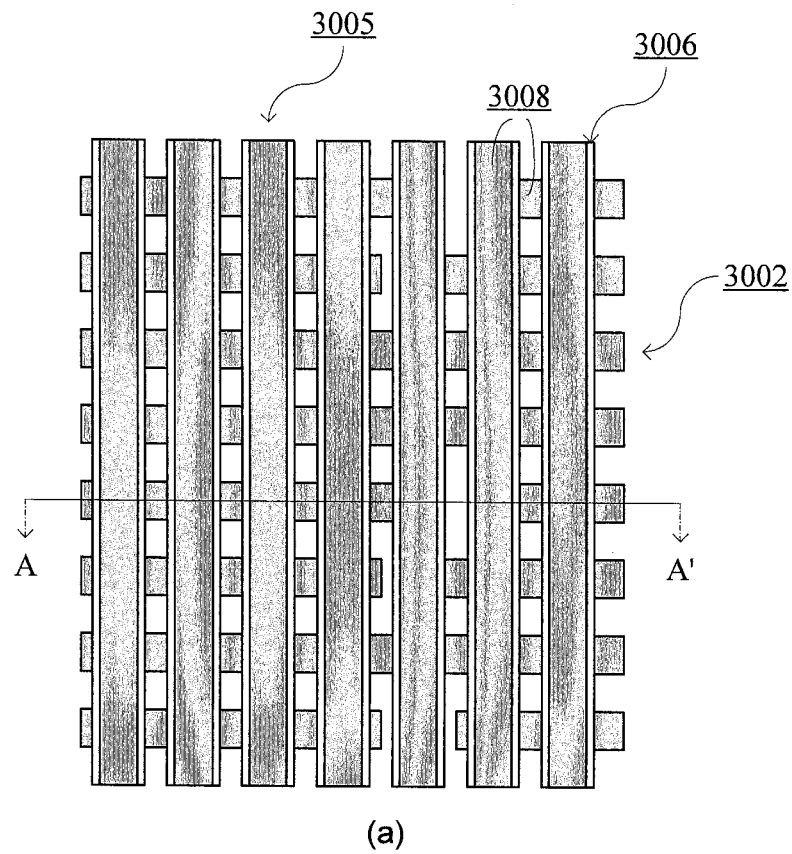
Figure 7:
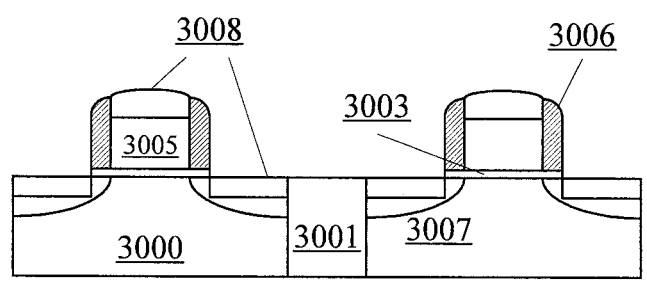
Figure 8:
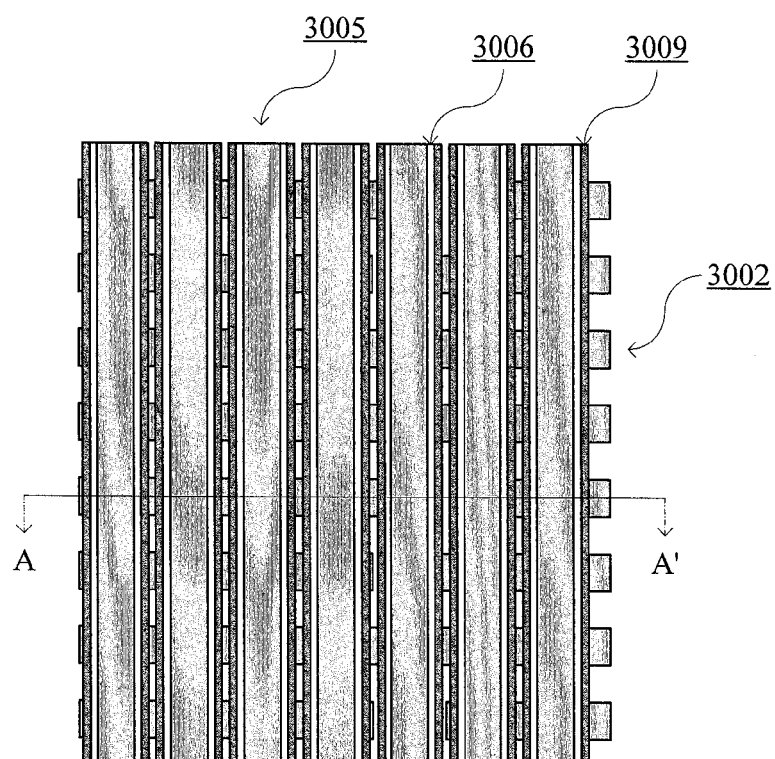
Figure 8:
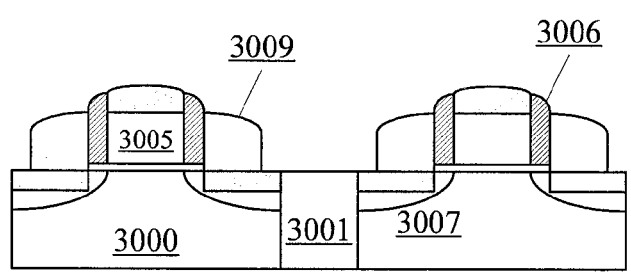
Figure 8:
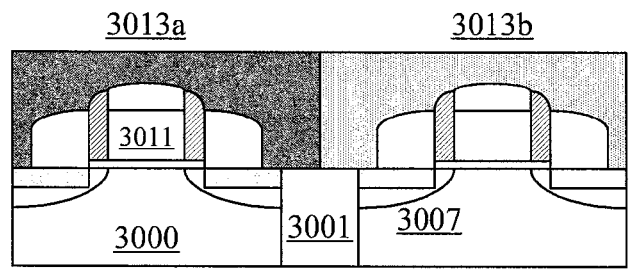

In contrary to the prior art, after the pattern of lines 3004 is formed, a pattern of cuts is not immediately formed using a cut mask. Instead, the gate material layer deposited on the wafer is etched directly using the pattern of lines 3004, so as to form parallel gate lines 3005, as shown in FIG. 6. Here, in a case where the gate dielectric layer 3003 is formed, optionally, the gate dielectric layer is also etched after etching the gate material layer, so that just potions of the gate dielectric layer underneath the etched gate material layer are remained.

After the gate lines 3005 are formed, conventional processes may be conducted in order to manufacture semiconductor devices such as transistors. For example, processes such as ion implantation (to perform doping so as to form, for example, sources/drains), spacer formation, silicidation, and dual stress liner integration, may be carried out, which will be described in the following.

Specifically, as shown in FIG. 7(a), gate spacers 3006 are formed surrounding the respective gate lines 3005. For example, the gate spacers 3006 may be formed by depositing on the entire structure one or more layers of dielectric materials, such as $SiO_2$, $Si_3N_4$, SiON, or the like, or any combination thereof, and then conducting Reactive Ion Etching (RIE, to selectively etch the dielectric materials with respect to the Si substrate) thereon. Since there is no cut in the gate lines 3005, the gate spacers 3006 are formed on both sides of the respective gate lines 3005 in the horizontal direction of the figure, except those formed at ends of the gate lines in the vertical direction.

If the gate dielectric layer is not etched in etching the gate material layer, then after the spacers 3006 are formed, it is possible to carry out etching along the spacers to remove portions of the gate dielectric layer 3003 located outside the spacers.

Further, source/drain regions 3007 may be formed on both sides of the respective gates in the substrate 3000 by ion implantation doping. Optionally, before the gate spacers are formed, source/drain extension regions and Halo regions (not shown) may be formed by tilted ion implantations.

Optionally, the source/drain regions 3007 and the gate lines 3005 may be subjected to silicidation to form a metal silicide layer 3008. The silicide may be formed by: depositing a metal layer, such as W, Co, and Ni, on the entire structure; conducting anneal at a high temperature to make the semiconductor material (Si in this embodiment) react with the metal so as to form the silicide; and finally removing the unreacted metal. FIG. 7(b) shows a part of a section view taken along A-A' in FIG. 7(a), where only two gate stacks isolated by the STI 3001 are shown for convenience.

Here, it is to be noted that the above processes (such as ion implantation, spacer formation, and silicidation) for manufacturing the semiconductor devices are not directly relevant to the subject matter of the disclosure, and thus will not be described in detail here. They may be implemented by conventional processes or by future developed processes, and the present disclosure is not limited thereto.

Next, as shown in FIG. 8(a), conductive spacers 3009 may be formed with a conductive material to surround the respective gate spacers 3006 described above. Likewise, since there is no cut in the gate lines 3005, the conductive spacers 3009 are formed on outer sides of the respective gate spacers 3006 in the horizontal direction of the figure, except those formed at the ends of the gate spacers in the vertical direction.

The conductive spacers 3009 may be made, for example, as follows. A conductive material layer is conformally deposited on the semiconductor substrate. Then, the deposited conductive material layer is selectively etched to remove portions thereof parallel to the substrate surface, leaving only portions thereof perpendicular to the substrate surface. Thereby, the conductive spacers 3009 are formed. Obviously, those skilled in the art can recognize other ways for manufacturing the conductive spacers 3009 as well as the above described gate spacers 3006.

FIG. 8(b) shows a part of a section view taken along A-A' in FIG. 8(a), where only two gate stacks isolated by the STI 3001 are shown for convenience. As shown in FIG. 8(b), the conductive spacers 3009 formed by the method described above are self-aligned on the source/drain regions 3007 of the semiconductor device, and thus may serve as contacts for electrical connections between the source/drain regions and the outside.

Optionally, the conductive spacers 3009 can be made of a stressed conductive material. For example, for a n-type Field Effect Transistor (NFET), the conductive spacers 3009 may be made of a tensile-stressed conductive material; and for a p-type Field Effect Transistor (PFET), the conductive spacers 3009 may be made of a compressive-stressed conductive material. There have been many researches on improvements of device performances by the stress, and thus detailed descriptions thereof are omitted here.

Specifically, for example, the conductive material which can apply the tensile stress may comprise any one of Al, Cr, Zr and the like, or any combination thereof, and the conductive material which can apply the compressive stress may comprise any one of Al, Ta, Zr and the like, or any combination thereof. References may be made to the following documents for explanations on how those materials apply the stress.

1. C. Cabral, Jr., L. A. Clevenger, & R. G. Schad, Repeated compressive stress increase with 400° C. thermal cycling in tantalum thin films due to increase in the oxygen content, Journal of Vacuum Science & Technology B: Microelectronics and Nanometer Structures, Vol. 12, Issue 4, pp. 2818-2821, 1994; and
2. Robert J. Drese, & Matthias Wuttig, In situ stress measurements in zirconium and zirconium oxide films prepared by direct current sputtering, JOURNAL OF APPLIED PHYSICS 99, 123517 (2006).

Next, an interlayer dielectric layer may be formed on the resultant structure. Generally, the interlayer dielectric layer may comprise nitride such as $Si_3N_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material.

Specifically, for example, the dielectric material which can apply the tensile stress may comprise a tensile-stressed metal oxide, such as Al oxide, Cr oxide, Zr oxide, or the like, or any combination thereof; and the dielectric material which can apply the compressive stress may comprise a compressive-stressed metal oxide, such as Al oxide, Ta oxide, Zr oxide, or the like, or any combination thereof. References may also be made to documents 1 and 2 as cited above for explanations on how those materials apply the stress.

FIG. 8(c) shows an example where a tensile-stressed interlayer dielectric layer 3013a is formed for a NFET (one on the left side in the figure) and a compressive-stressed interlayer dielectric layer 3013b is formed for a PFET (one on the right side in the figure).

Figure 9:
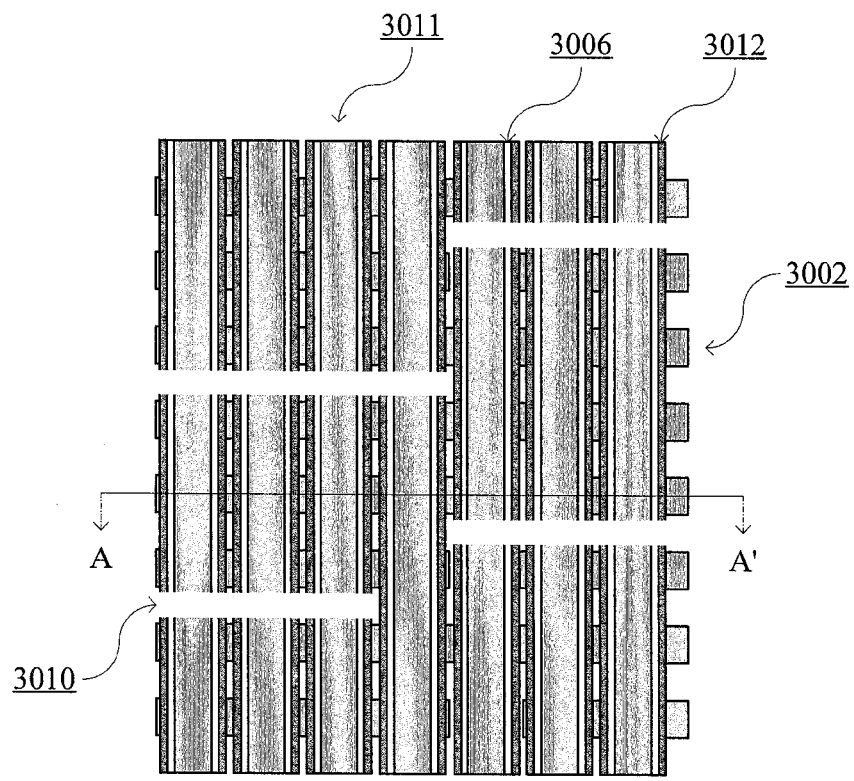
Figure 10:
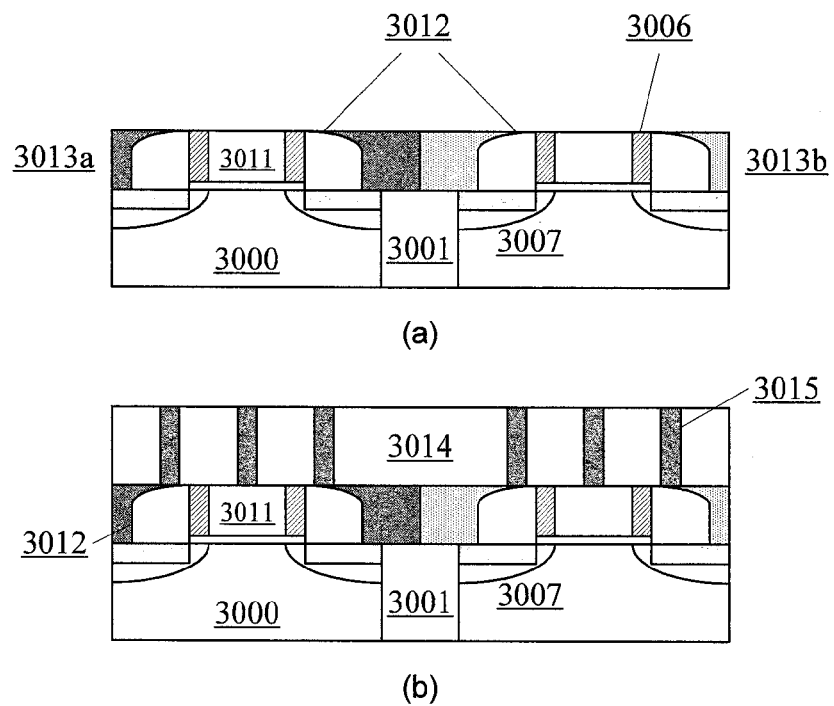

Subsequently, as shown in FIG. 9, the gate lines 3005, together with the surrounding gate spacers 3006 and the surrounding conductive spacers 3009, are cut off at predetermined regions according to the design, to achieve inter-device electrical isolations (in FIG. 9, the interlayer dielectric layers 3013a and 3013b are not shown for clarity). In general, the cuts are made above the STIs 3001, with a cut width (in the vertical direction of the figure) of about 1-10 nm. The cutting may be implemented, for example, by RIE, a laser cutting etch, etc. with the use of a cut mask. For instance, if the cutting is done by means of etching, a photo resist may be coated on the substrate and then patterned by the cut mask so that the predetermined regions corresponding to the cuts to be formed are exposed. Then, exposed portions of the gate lines 3005 as well as their surrounding spacers 3006 and surrounding conductive spacers 3009 are cut off, so as to form the cuts 3010. As a result, the cut gate lines 3005 result in electrically isolated gates 3011, and the cut conductive spacers 3009 result in electrically isolated contacts 3012. Here, the cuts 3010 are positioned above the STIs 3001. The cuts 3010 may be filled with a further interlayer dielectric layer (for example, an interlayer dielectric layer 3014 as described below) subsequently.

Here, it is to be noted that it is also possible not to cut off the gate spacers 3006. For example, in the example where the cutting is implemented by means of etching, the etchant may be selected so that the etching does not impact the gate spacers 3006 substantially. Since the gate spacers 3006 are insulating, they will not impact the inter-device electrical isolations.

Alternatively, instead of cutting off the gate lines 3005 and the conductive spacers 3009, oxygen (atoms) may be implanted into the cut positions so that the semiconductor material (for example, Si) of the gate lines 3005 and the conductive material (for example, metal such as Al, Cr, Zr, Ta, or the like) of the conductive spacers 3009 at the predetermined regions are subjected to oxidation and thus are converted to insulating oxides. As a result, due to the resultant oxides, portions of a respective gate line 3005 on opposing sides of a cut position are electrically isolated from each other (which has an effect equivalent to the cutting) to form electrically isolated gates 3011, and portions of a respective conductive spacer 3009 on opposing sides of a cut position are electrically isolated from each other (which has an effect equivalent to the cutting) to form electrically isolated contacts 3012. Of course, the implanted species is not limited to oxygen. Those skilled in the art can select appropriate implantation species based on the materials used for the gate lines 3005 and the conductive spacers 3009 so that they can react to generate dielectric materials and thus achieve the electrical isolations.

Thus, the fabrication of the semiconductor device structure according to this disclosure is substantially finished.

In the above embodiment, the interlayer dielectric layers 3013a and 3013b are formed before the "cutting" or "isolation" of the gate lines and the conductive spacers (and optionally, also the gate spacers). However, it is also possible to perform the "cutting" or "isolation" of the gate lines and the conductive spacers (and optionally, also the gate spacers) before the formation of the interlayer dielectric layers 3013a and 3013b.

FIG. 10(a) is a sectional view showing a semiconductor device structure manufactured according to the above described method. Here, only two gate stacks are shown for convenience. In FIG. 10(a), the shown structure has already been subjected to planarization such as Chemical Mechanical Polishing (CMP) to expose the contacts 3012. As a result, the gate stacks are substantially flush with the contacts 3012, which will facilitate the subsequent processes. The planarization process may be carried out immediately after the formation of the interlayer dielectric layers 3013a and 3103b, or may be carried out after the "cutting" or "isolation". In FIG. 10(a), no metal silicide is shown at the top of the gates 3011 for clarity. However, in practice, the silicide layer may remain on the top of the gates 3011.

As shown in FIG. 10(a), the semiconductor device structure comprises a plurality of unit devices. Each of the unit devices may comprise a gate stack formed on the semiconductor substrate. The gate stack can include the gate dielectric layer 3003 and the gate 3011 on the gate dielectric layer. The unit device may further comprise the gate spacer 3006 formed on both sides of the gate stack and the contacts 3012 abutting against the outer side of the gate spacer 3006. In this structure, adjacent unit devices in a gate width direction (i.e., the vertical direction in FIG. 9, and the direction perpendicular to the paper sheet in FIG. 10(a)) are electrically isolated from each other at the predetermined regions.

Specifically, the gates 3011, the gate spacers 3006 and the contacts 3012 of the respective unit devices neighboring in the gate width direction are made from one gate line 3005, one gate spacer 3006, and one conductive spacer 3009, respectively. The gate line 3005 and the conductive spacer 3009 comprise isolations at the predetermined regions, so that the neighboring unit devices are electrically isolated. The isolations may comprise the cuts formed by means of etching, or the insulating materials converted from the gate line and the conductive spacer (for example, the oxides formed by implanting oxygen into the cut positions as described above). The cuts may have dielectric material(s) filled therein. For example, in a case where the interlayer dielectric layers 3013a and 3013b are formed after the cutting, the cuts may have the materials of the interlayer dielectric layers 3013a and 3013b filled therein. Or alternatively, in a case where the interlayer dielectric layers 3013a and 3013b are formed before the cutting, the cuts may have the material of the subsequently formed interlayer dielectric layer (for example, the interlayer dielectric layer 3014 as described below) filled therein. In this disclosure, at the predetermined regions, there is no material of the gate spacers existing between opposing end faces of the gates, unlike the conventional art where the gate spacer surrounds the gate.

The source/drain regions 3007 are formed on both sides of the gate 3011. Above the source/drain regions 3007, there may be the metal silicide contacts 3008.

Optionally, in the gate width direction, opposing end faces of the gates or opposing end faces of the contacts of adjacent unit devices may have a distance of about 1-10 nm therebetween.

Optionally, the contacts 3012 and the interlayer dielectric layers 3013a and 3013b can apply the tensile stress (for a NFET) and/or the compressive stress (for a PFET).

Further, as shown in FIG. 10(b), a further interlayer dielectric layer 3014 may be formed on the resultant structure. Then, upper contacts 3015 may be formed on the gates 3011 and on the lower contacts 3012 for the source/drain regions 3007. On the source/drain regions 3007, the lower contacts 3012 are aligned with the upper contacts 3015 so that electrical contacts are achieved.

Second Embodiment

The method according to the present disclosure is also compatible with the replacement gate process. Hereinafter, a second embodiment of the present disclosure is described with reference to FIGS. 11-13, where the replacement gate process is incorporated. That is, a sacrificial gate line is first formed, and then is replaced with a replacement gate line.

In the following, emphasis is given to the differences of the second embodiment from the first embodiment and descriptions of the same processes are omitted. Like reference numbers denote like parts throughout the drawings.

As shown in FIG. 11(a), sacrificial gate lines 3005 are formed by printing a pattern of parallel gate lines and then carrying out etching, like the first embodiment. Usually, the sacrificial gate lines 3005 are made of poly silicon. Then, the process continues conventionally to form the semiconductor device structure. For example, source/drain regions 3007 may be formed into the semiconductor substrate on both sides of the respective sacrificial gate lines 3005, gate spacers 3006 may be formed to surround the respective sacrificial gate lines 3005, and a metal silicide layer 3008 may be formed on the source/drain regions 3007. Since there is no cut in the gate lines 3005, the gate spacers 3006 are formed on both sides of the respective gate lines 3005 in the horizontal direction of the figure, except those formed at ends of the gate lines in the vertical direction. Here, a pattern of active regions 3002 on the semiconductor substrate is also shown.

Figure 11:
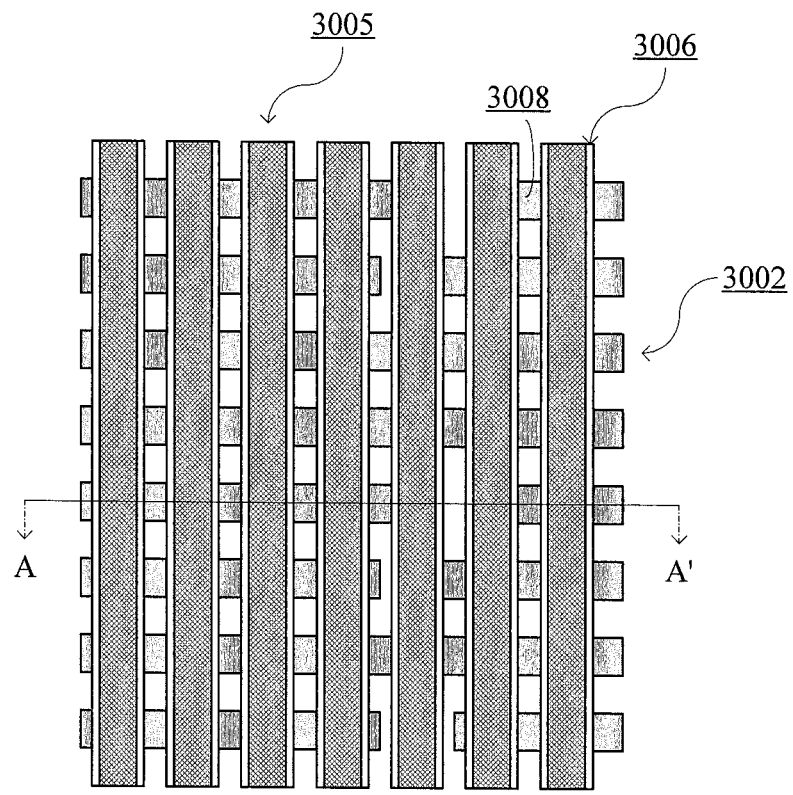
FIGS. 11-13 are schematic diagrams showing device structures during the fabrication of a semiconductor device structure according to a second embodiment of the present disclosure.
Figure 11:
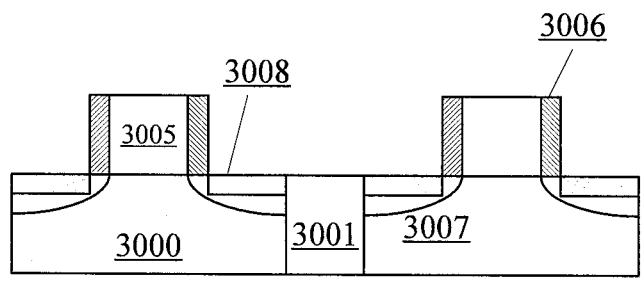

FIG. 11(*b*) shows a part of a section view taken along A-A' in FIG. 11(*a*), where only two gate stacks isolated by the STI 3001 are shown for convenience. As shown in FIG. 11(*b*), in this embodiment, the sacrificial gate lines 3005 are made of poly silicon and thus have no metal silicide layer thereon. It is to be noted that in the gate stack there may be a sacrificial gate dielectric (not shown) underneath the respective sacrificial gate lines 3005.

Figure 12:
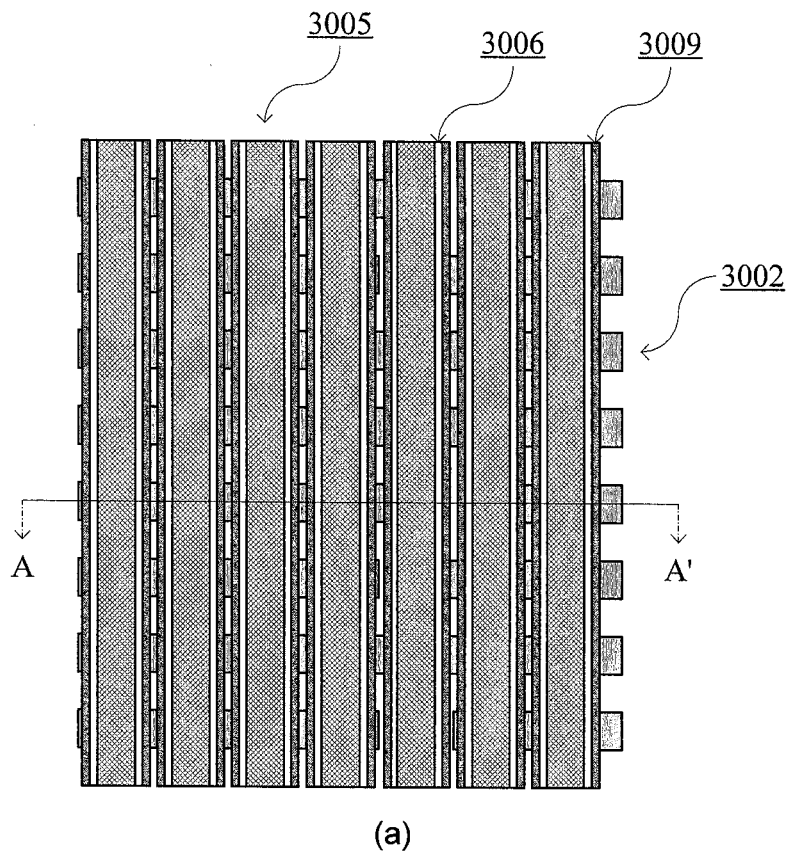
Figure 12:
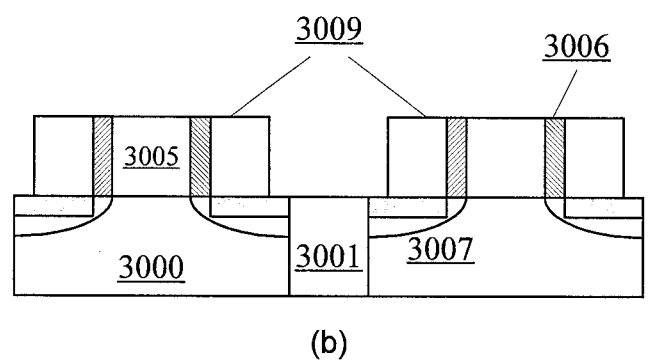

Next, as shown in FIGS. 12(*a*) and 12(*b*), conductive spacers 3009 are formed to surround the respective gate spacers 3006. The conductive spacers 3009 are self-aligned with the source/drain regions of the semiconductor devices and thus can serve as contacts for electrical connections between the source/drain regions and the outside.

Optionally, the conductive spacers 3009 can be made of a stressed conductive material. For example, for a NFET, the conductive spacers 3009 may be made of a tensile-stressed conductive material; and for a PFET, the conductive spacers 3009 may be made of a compressive-stressed conductive material. There have been many researches on improvements of device performances by the stress, and thus detailed descriptions thereof are omitted here. Specifically, for example, the conductive material which can apply the tensile stress may comprise any one of Al, Cr, Zr, and the like, or any combination thereof, and the conductive material which can apply the compressive stress may comprise any one of Al, Ta, Zr, and the like, or any combination thereof.

Next, an interlayer dielectric layer may be formed on the resultant structure. Generally, the interlayer dielectric layer may comprise nitride such as $Si_3N_4$. In this disclosure, optionally, to further improve the device performance, the interlayer dielectric layer may be made of a stressed dielectric material. For example, for a NFET, the interlayer dielectric layer may comprise a tensile-stressed dielectric material; and for a PFET, the interlayer dielectric layer may comprise a compressive-stressed dielectric material. Specifically, for example, the dielectric material which can apply the tensile stress may comprise a tensile-stressed metal oxide, such as Al oxide, Cr oxide, Zr oxide, or the like, or any combination thereof; and the dielectric material which can apply the compressive stress may comprise a compressive-stressed metal oxide, such as Al oxide, Ta oxide, Zr oxide, or the like, or any combination thereof.

Figure 13:
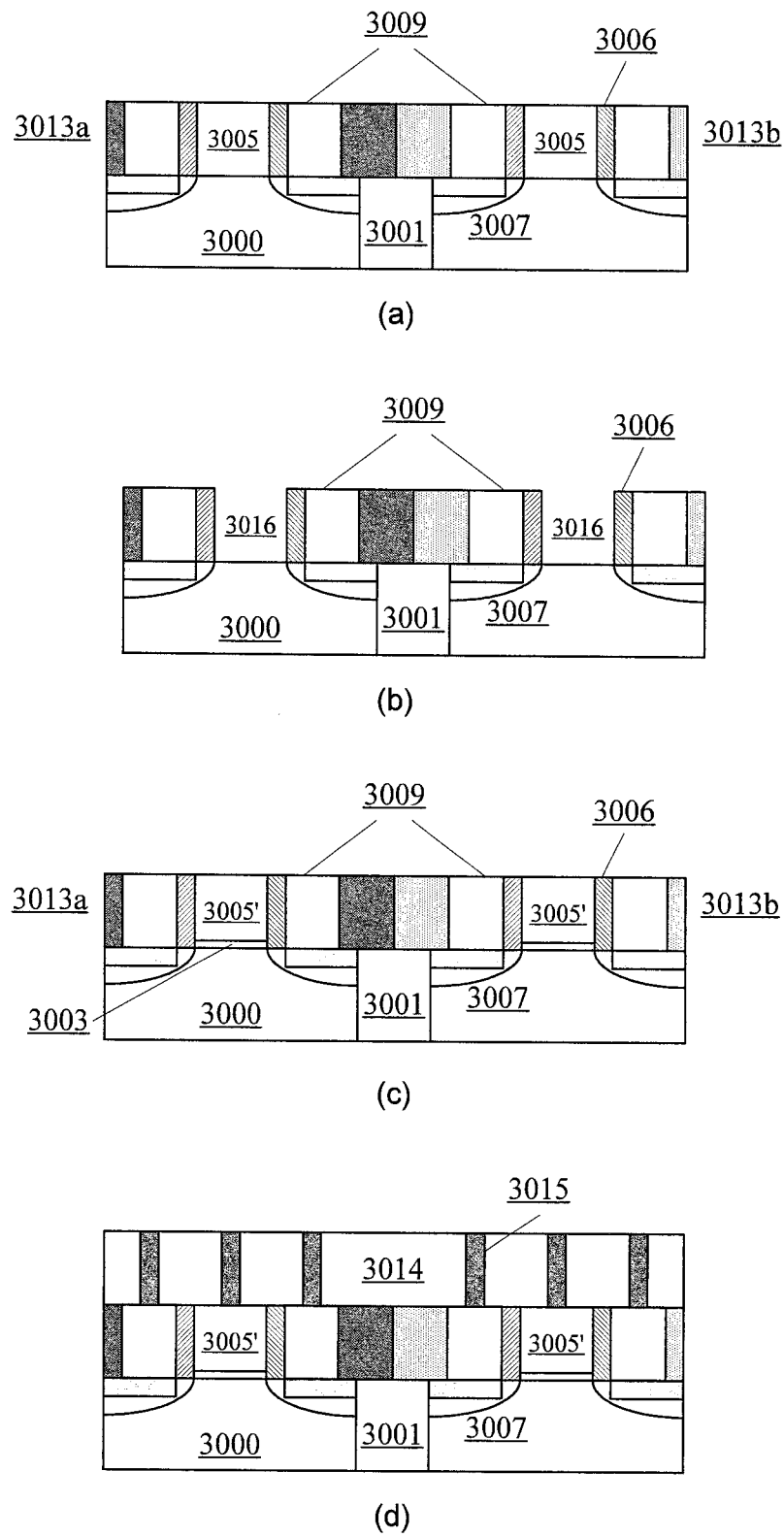

FIG. 13(*a*) shows an example where a tensile-stressed interlayer dielectric layer 3013*a* is formed for a NFET (one on the left side in the figure) and a compressive-stressed interlayer dielectric layer 3013*b* is formed for a PFET (one on the right side in the figure). Here, optionally, the interlayer dielectric layers 3013*a* and 3013*b* may be subjected to planarization such as CMP to expose the sacrificial gate lines 3005 to facilitate the subsequent replacement gate process.

Next, as shown in FIG. 13(*b*), the sacrificial gate lines 3005, or in a case where the sacrificial gate dielectric is formed, both the sacrificial gate lines and the sacrificial gate dielectric, are removed by means of, for example, etching or the like, resulting in openings 3016 inside the gate spacers 3006. Then, as shown in FIG. 13(*c*), replacement gate lines 3005' or replacement gate stacks are formed in the openings 3016. If there is no gate dielectric layer on the semiconductor substrate, a gate dielectric layer 3003 such as a high-K gate dielectric layer may be formed in the openings before the formation of the replacement gate lines 3005'. Those skilled in the art can devise various ways to implement the replacement process for the gate lines.

Optionally, a planarization process such as CMP may be performed after the formation of the replacement gate lines 3005', so as to make the replacement gate lines 3005' have the same height as the conductive spacers 3009, which will facilitate the subsequent processes.

Next, electric isolations between unit devices are performed at predetermined regions by means of a cut mask, like the first embodiment (referring to FIG. 9). Specifically, the electric isolations can be performed by cutting off the replacement gate lines 3005' and the conductive spacers 3009 at the predetermined regions. Or alternatively, the electric isolations can be performed by implanting oxygen into the predetermined regions so that the semiconductor material (for example, Si) of the gate lines 3005' and the conductive material (for example, metal such as Al, Cr, Zr, Ta or the like) are subjected to oxidation to form insulating oxides.

Further, as shown in FIG. 13(*d*), to complete the front end of line (FEOL) process, a further interlayer dielectric layer 3014 may be formed on the resultant structure, and upper contacts 3015 may be formed therein. Here, the interlayer dielectric layer 3014 may fill unfilled gaps in the cuts, so as to enhance the electrical isolations between unit devices neighboring in the gate width direction. In this embodiment, it is clear from FIG. 13(*d*) that, in forming the upper contacts 3015, the etching depths for the upper contacts on the gate regions and those on the source/drain regions are the same. Thus, it is possible to simplify the etching process.

Here, it should be noted that, although the replacement gate process is conducted before the cutting process in the above described embodiment, the present disclosure is not limited thereto. It is also feasible to conduct the cutting process before the replacement gate process. For example, the sacrificial gate lines 3005 and the conductive spacers 3009 may be cut off immediately after the conductive spacers 3009 are formed so as to form the electrically isolated gates and the electrically isolated contacts 3012. Then, the replacement gate process is conducted to form the replacement gates. In a word, the sequences of the steps in various embodiments of the present disclosure are not limited to those described above.

In the second embodiment, the gate spacers and the conductive spacers are all in a shape of "I", which are different from those in a shape of "D" in the first embodiment. The "I" shaped spacers have a benefit that they have the same height as the gate stacks so that the planarization process or the deposition of the interlayer dielectric layers 3013*a* and 3013*b* is unnecessary before depositing the interlayer dielectric layer 3014 and forming the upper contacts therein. Those skilled in the art know various ways to form the "I" shaped spacers, and thus detailed descriptions thereof are omitted here. Also, the "I" shaped spacers are applicable to the first embodiment.

As described above, in the embodiments of the present disclosure, the pattern of parallel gate lines will not be subjected to the inter-device electrical isolation process by means of the cut mask immediately after being printed on the substrate, unlike the prior art. In contrary, the pattern of parallel gate lines is directly used in gate lines etching. Subsequently, processes for forming the semiconductor device structure are performed. Then, surrounding the gates, more specifically, surrounding the gate spacers, contacts to source/drain regions are formed in a self-aligned manner in a form of spacer.

Finally, the inter-device electrical isolations are performed using the cut mask by means of, for example, cutting, oxidation, or the like.

According to embodiments of the present disclosure, the electrical isolations (for example, cutting or oxidation) between the unit devices can be performed anytime after the conductive spacers are formed, so as to finally complete the FEOL process for the semiconductor device structure. In other words, the isolation process may be performed after the formation of the conductive spacers and before the completion of metal interconnections for the semiconductor device structure.

Therefore, according to the present disclosure, the gate pattern is cut off or isolated at a later stage so that the ends of a pair of opposing gates can be closer to each other. Further, in the present disclosure, the isolation process is conducted to isolate the devices from one another after the formation of the gate spacers and the conductive spacers. Therefore, there will be no spacer materials remained between the ends of the opposing unit devices, and there will be no defects such as voids, unlike the prior art. In addition, the conductive spacers (that is, the contacts) for respective devices are entirely isolated from one another by the cuts or the isolations, and thus it is possible to achieve good electrical isolation between the devices.

Further, unlike the prior art where contacts are formed by etching contact holes and then filling the contact holes with conductive materials, according to embodiments of the disclosure, the contacts are formed in a form of spacer, thus eliminating the difficulty in forming the contact holes in the prior art. Also, such contacts in a form of spacer are self-aligned on the source/drain regions, and therefore the process is dramatically simplified. At the same time, it is impossible to form such self-aligned contacts in a form of conductive spacer according to the conventional processes. This is because in the conventional processes, the spacer formation process is conducted after the cuts are formed. In this case, during the formation of the spacers, especially, during the forming of the conductive spacers, conductive materials may enter into the cuts. This will possibly cause the respective conductive spacers of a pair of opposing gates not completely isolated from each other, and thus the corresponding devices will electrically contact with each other.

Furthermore, the present disclosure is compatible with the replacement gate process. Thus, it is possible to have various options for processes.

Moreover, in the present disclosure, the conductive spacers (that is, the contacts) and the gate stacks may be made to have the same height by, for example, the planarization process. This facilitates the subsequent processes.

Further, in the above descriptions the resultant unit device is a common planar Complementary Metal Oxide Field Effect Transistor (CMOSFET). However, it should be understood by those skilled in the art that the unit device may be formed as a non-planar Fin Field Effect Transistor (FinFET). Those two types of devices differ from each other just in that active regions are arranged differently and thus gates on the active regions are arranged differently.

The mere fact that benefic measures described above in the different embodiments is not intended to mean that those measures cannot be used in combination to advantage.

In the above descriptions, details of patterning and etching of the layers are not described. It is understood by those skilled in the art that various measures in the prior art may be utilized to form the layers and regions in desired shapes.

Further, to achieve the same feature, those skilled in the art can devise processes not entirely the same as those described above.

The present disclosure is described above with reference to embodiments thereof. However, these embodiments are provided just for illustrative purposes, rather than limiting the present disclosure. The scope of the disclosure is defined by the attached claims as well as equivalents thereof. Those skilled in the art can make various replacements and modifications without departing from the scope of the disclosure, and the various replacements and modifications all fall into the scope of the disclosure.

We claim:

1. A semiconductor device structure, comprising:
   a semiconductor substrate; and
   a plurality of unit devices formed on the semiconductor substrate, each of the unit devices comprising:
      a gate formed on the semiconductor substrate;
      source and drain regions on opposite sides of the gate in a gate length direction;
      gate spacers formed on respective side surfaces of the gate extending in a gate width direction perpendicular to the gate length direction; and
      conductive spacers serving as contacts to the source and drain regions and formed on respective outer side surfaces of the respective gate spacers extending in the gate width direction, wherein the contacts comprise a stressed conductive material,
   wherein for at least a first unit device and a second unit device adjacent to each other in the gate width direction, their respective gates extend in a substantially straight line along the gate width direction, their respective gate spacers extend in a substantially straight line along the gate width direction, and their respective contacts extends in a substantially straight line along the gate width direction,
   wherein an end surface of the gate of the first unit device facing the second unit device, end surfaces of the gate spacers of the first unit device facing the second unit device, and end surfaces of the contacts of the first unit device facing the second device are substantially flush with each other,
   and wherein there is an electrical isolation between the first unit device and the second unit device.

2. The semiconductor device structure according to claim 1, wherein the electrical isolation comprises a dielectric material between the end surface of the gate of the first unit device and an opposite end surface of the gate of the second unit device and also between the end surfaces of the contacts of the first unit device and opposite end surfaces of the contacts of the second unit device.

3. The semiconductor device structure according to claim 2, wherein the dielectric material is further provided between the end surfaces of the gate spacers of the first unit device and opposite end surfaces of the gate spacers of the second unit device.

4. The semiconductor device structure according to claim 2, wherein the dielectric material comprise oxides of a material for the gate and also of a material for the contacts.

5. The semiconductor device structure according to claim 1, wherein the stressed conductive material comprises:
   any one of Al, Cr, and Zr which applies tensile stress, or any combination thereof; or
   any one of Al, Ta, and Zr which applies compressive stress, or any combination thereof.

6. The semiconductor device structure according to claim 1, further comprising:

a stressed interlayer dielectric layer formed on both the semiconductor substrate and the unit devices.

7. The semiconductor device structure according to claim 6, wherein the interlayer dielectric layer comprises:
   any one of Al oxide, Cr oxide, and Zr oxide which applies tensile stress, or any combination thereof; or
   any one of Al oxide, Ta oxide, and Zr oxide which applies compressive stress, or any combination thereof.

8. The semiconductor device structure according to claim 1, wherein the unit device comprises a planar Complementary Metal Oxide Field Effect Transistor and/or a Fin Field Effect Transistor.

* * * * *

UNITED STATES PATENT AND TRADEMARK OFFICE
CERTIFICATE OF CORRECTION

PATENT NO. : 9,293,377 B2
APPLICATION NO. : 13/266607
DATED : March 22, 2016
INVENTOR(S) : Zhong et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1182 days.

Signed and Sealed this
Sixteenth Day of August, 2016

Michelle K. Lee
*Director of the United States Patent and Trademark Office*